(12) United States Patent
Scanlan et al.

(10) Patent No.: US 9,831,170 B2
(45) Date of Patent: Nov. 28, 2017

(54) FULLY MOLDED MINIATURIZED SEMICONDUCTOR MODULE

(71) Applicant: DECA Technologies Inc., Tempe, AZ (US)

(72) Inventors: Christopher M. Scanlan, Chandler, AZ (US); Timothy L. Olson, Phoenix, AZ (US)

(73) Assignee: DECA Technologies, Inc., Tempe, AZ (US)

( * ) Notice: Subject to any disclaimer, the term of this patent is extended or adjusted under 35 U.S.C. 154(b) by 0 days.

(21) Appl. No.: 15/354,447

(22) Filed: Nov. 17, 2016

(65) Prior Publication Data
US 2017/0077022 A1 Mar. 16, 2017

Related U.S. Application Data

(63) Continuation-in-part of application No. 14/930,514, filed on Nov. 2, 2015, now Pat. No. 9,576,919, which
(Continued)

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ......... H01L 23/00; H01L 23/48; H01L 24/05; H01L 21/561; H01L 21/568;
(Continued)

(56) References Cited

U.S. PATENT DOCUMENTS

| | | |
|---|---|---|
| 4,740,414 A | 4/1988 | Shasheen |
| 5,548,091 A | 8/1996 | DiStefano et al. |

(Continued)

FOREIGN PATENT DOCUMENTS

| | | |
|---|---|---|
| EP | 1229577 | 8/2002 |
| JP | H03255970 A | 11/1991 |

(Continued)

OTHER PUBLICATIONS

Kwak, Hocheol and Hubing. Todd, An Overview of Advanced Electronic Packaging Technology, May 1, 2007.
(Continued)

*Primary Examiner* — Alexander Oscar Williams
(74) *Attorney, Agent, or Firm* — Booth Udall Fuller, PLC

(57) ABSTRACT

A semiconductor module can comprise a fully molded base portion comprising a planar surface that further comprises a semiconductor die comprising contact pads, conductive pillars coupled to the contact pads and extending to the planar surface, and an encapsulant material disposed over the active surface, four side surfaces, and around the conductive pillars, wherein ends of the conductive pillars are exposed from the encapsulant material at the planar surface of the fully molded base portion. A build-up interconnect structure comprising a routing layer can be disposed over the fully molded base portion. A photo-imageable solder mask material can be disposed over the routing layer and comprise openings to form surface mount device (SMD) land pads electrically coupled to the semiconductor die and the conductive pillars. A SMD component can be electrically coupled to the SMD land pads with surface mount technology (SMT).

20 Claims, 9 Drawing Sheets

Related U.S. Application Data is a continuation-in-part of application No. 14/642,531, filed on Mar. 9, 2015, now Pat. No. 9,177,926, and a continuation-in-part of application No. 14/584,978, filed on Dec. 29, 2014, now Pat. No. 9,337,086, which is a continuation of application No. 14/024,928, filed on Sep. 12, 2013, now Pat. No. 8,922,021, which is a continuation of application No. 13/632,062, filed on Sep. 30, 2012, now Pat. No. 8,535,978, which is a continuation-in-part of application No. 13/341,654, filed on Dec. 30, 2011, now Pat. No. 8,604,600.

(60) Provisional application No. 62/258,040, filed on Nov. 20, 2015, provisional application No. 61/950,743, filed on Mar. 10, 2014, provisional application No. 61/672,860, filed on Jul. 18, 2012.

(51) Int. Cl.
*H01L 21/56* (2006.01)
*H01L 21/66* (2006.01)
*H01L 23/00* (2006.01)
*H01L 23/31* (2006.01)
*H01L 23/48* (2006.01)
*H01L 23/552* (2006.01)

(52) U.S. Cl.
CPC ........ *H01L 21/4867* (2013.01); *H01L 21/561* (2013.01); *H01L 21/565* (2013.01); *H01L 21/568* (2013.01); *H01L 22/14* (2013.01); *H01L 22/34* (2013.01); *H01L 23/3114* (2013.01); *H01L 23/48* (2013.01); *H01L 23/49822* (2013.01); *H01L 23/49894* (2013.01); *H01L 23/552* (2013.01); *H01L 24/02* (2013.01); *H01L 24/05* (2013.01); *H01L 24/13* (2013.01); *H01L 24/19* (2013.01); *H01L 24/20* (2013.01); *H01L 24/92* (2013.01); *H01L 24/96* (2013.01); *H01L 24/97* (2013.01); *H01L 23/3128* (2013.01); *H01L 23/562* (2013.01); *H01L 24/03* (2013.01); *H01L 24/11* (2013.01); *H01L 24/94* (2013.01); *H01L 2224/0239* (2013.01); *H01L 2224/02311* (2013.01); *H01L 2224/02313* (2013.01); *H01L 2224/02331* (2013.01); *H01L 2224/02377* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04105* (2013.01); *H01L 2224/05008* (2013.01); *H01L 2224/05024* (2013.01); *H01L 2224/0558* (2013.01); *H01L 2224/05147* (2013.01); *H01L 2224/05166* (2013.01); *H01L 2224/05548* (2013.01); *H01L 2224/05568* (2013.01); *H01L 2224/05569* (2013.01); *H01L 2224/05572* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05687* (2013.01); *H01L 2224/1132* (2013.01); *H01L 2224/1145* (2013.01); *H01L 2224/11334* (2013.01); *H01L 2224/11452* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13024* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/2101* (2013.01); *H01L 2224/214* (2013.01); *H01L 2224/215* (2013.01); *H01L 2224/24137* (2013.01); *H01L 2224/32225* (2013.01); *H01L 2224/73267* (2013.01); *H01L 2224/81815* (2013.01); *H01L 2224/92* (2013.01); *H01L 2224/92244* (2013.01); *H01L 2224/94* (2013.01); *H01L 2224/95001* (2013.01); *H01L 2224/96* (2013.01); *H01L 2224/97* (2013.01); *H01L 2924/12041* (2013.01); *H01L 2924/12042* (2013.01); *H01L 2924/13091* (2013.01); *H01L 2924/14* (2013.01); *H01L 2924/15313* (2013.01); *H01L 2924/181* (2013.01); *H01L 2924/18161* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01); *H01L 2924/3511* (2013.01)

(58) Field of Classification Search
CPC ........ H01L 23/49838; H01L 23/49822; H01L 23/314; H01L 23/49894; H01L 24/16; H01L 22/34; H01L 21/4857; H01L 21/565; H01L 21/4867; H01L 22/14; H01L 21/4853; H01L 2224/16227; H01L 23/498; H01L 21/48; H01L 21/56; H01L 21/66; H01L 23/31
USPC ........ 257/48, 668, 737, 738, 777, 778, 723, 257/686, 685, 734
See application file for complete search history.

(56) References Cited

U.S. PATENT DOCUMENTS

| | | |
|---|---|---|
| 5,729,896 A * | 3/1998 | Dalal ................ H01L 23/49816 174/260 |
| 5,759,737 A * | 6/1998 | Feilchenfeld ............ G03F 7/00 257/E21.503 |
| 6,933,176 B1 | 8/2005 | Kirloskar |
| 7,456,496 B2 | 11/2008 | Hwee et al. |
| 7,476,980 B2 | 1/2009 | Rebibis et al. |
| 7,482,203 B2 | 1/2009 | Song et al. |
| 7,550,857 B1 | 6/2009 | Longo et al. |
| 7,777,351 B1 | 8/2010 | Berry et al. |
| 7,829,380 B2 | 11/2010 | Irsigler et al. |
| 7,843,052 B1 | 11/2010 | Yoo et al. |
| 8,030,770 B1 | 10/2011 | Juskey et al. |
| 8,237,259 B2 | 8/2012 | Pressel et al. |
| 8,288,209 B1 | 10/2012 | Chi et al. |
| 8,436,255 B2 | 5/2013 | Goh |
| 8,487,435 B2 | 7/2013 | Juskey et al. |
| 8,653,674 B1 | 2/2014 | Darveaux et al. |
| 2003/0027373 A1 | 2/2003 | Distefano et al. |
| 2003/0092217 A1 | 5/2003 | Coyle |
| 2003/0164554 A1 | 9/2003 | Fee et al. |
| 2004/0113283 A1 | 6/2004 | Farnworth |
| 2005/0208700 A1 | 9/2005 | Kwon et al. |
| 2006/0001152 A1 | 1/2006 | Hu |
| 2006/0275949 A1 | 12/2006 | Farnworth et al. |
| 2006/0291029 A1 | 12/2006 | Lin et al. |
| 2008/0237828 A1 | 10/2008 | Yang |

(56) References Cited

U.S. PATENT DOCUMENTS

| | | |
|---|---|---|
| 2009/0302484 A1 | 12/2009 | Lee et al. |
| 2010/0052135 A1 | 3/2010 | Shim et al. |
| 2010/0167471 A1 | 7/2010 | Jin et al. |
| 2010/0195299 A1 | 8/2010 | Souriau et al. |
| 2010/0308474 A1 | 12/2010 | Shibuya et al. |
| 2011/0001215 A1 | 1/2011 | Lam |
| 2011/0042796 A1 | 2/2011 | Chang et al. |
| 2011/0095413 A1 | 4/2011 | Barth et al. |
| 2011/0115083 A1* | 5/2011 | Zang ............... H01L 21/563 257/738 |
| 2011/0156250 A1 | 6/2011 | Goh et al. |
| 2011/0186977 A1 | 8/2011 | Chi et al. |
| 2011/0193205 A1 | 8/2011 | Hsieh |
| 2011/0194260 A1* | 8/2011 | Jung ............... H05K 3/3452 361/746 |
| 2011/0202896 A1 | 8/2011 | Scanlan et al. |
| 2011/0250396 A1 | 10/2011 | Matsutani et al. |
| 2012/0032314 A1 | 2/2012 | Chen et al. |
| 2012/0119373 A1 | 5/2012 | Hunt |
| 2012/0133001 A1 | 5/2012 | Tkaczyk et al. |
| 2013/0026658 A1 | 1/2013 | Chen |
| 2013/0062760 A1 | 3/2013 | Hung et al. |
| 2013/0168848 A1 | 7/2013 | Lin et al. |
| 2013/0168849 A1 | 7/2013 | Scanlan |
| 2013/0270682 A1 | 10/2013 | Hu et al. |
| 2013/0280826 A1 | 10/2013 | Scanlan et al. |
| 2013/0307140 A1 | 11/2013 | Huang et al. |
| 2013/0334698 A1 | 12/2013 | Mohammed et al. |
| 2014/0042600 A1 | 2/2014 | Kim et al. |
| 2014/0054802 A1 | 2/2014 | Shim |
| 2014/0057394 A1 | 2/2014 | Ramasamy et al. |
| 2014/0102772 A1 | 4/2014 | Chen et al. |
| 2014/0335658 A1 | 11/2014 | Scanlan et al. |

FOREIGN PATENT DOCUMENTS

| | | |
|---|---|---|
| WO | WO2009006284 | 1/2009 |
| WO | WO2009009436 | 1/2009 |
| WO | WO2010/080068 A1 | 7/2010 |
| WO | 2013103216 | 7/2013 |

OTHER PUBLICATIONS

Kripesh, Vaidyanathan et al., Design and Development of a Multi-Die Embedded Micro Wafer Level Package, Institute of Microelectronics, Singapore, 2008.

Micronews, Fan-in WLCSP matures, what's next?, 3 D Packaging Magazine, Issue 14, Feb. 2008, pp. 2-5.

Th, E.K. et al, Encapsulation Challenges for Wafer Level Packaging, Electronics Packaging Technology Conference, 2009.

R Anderson, et al., Advances in WLCSP Technologies for Growing Market Needs, SMTA's 6th AMual International Wafer Level Packaging Conference, Oct. 27-30, 2009, Santa Clara, CA.

Kanth et al., Design and Development of True-CSP, United Test & Assembly Center Ltd (UTAC).

Hunt, John, Value Engineered Wafer Level Packages for Mobile Devices, Jul. 9, 2013.

Fan et al., Design and optimization of thermo-mechanical reliability in wafer level packaging, Jul. 4, 2009.

Motohashi et al., System in Wafer-Level Package Technology with RDL—first Process, Kanagawa, Japan.

Nishio, 3D package technologies review with gap analysis for mobile application requirements, STATS ChipPAC, Japan, Apr. 22, 2014.

Krohnert et al., System-in-package (SiP) on wafer level, enabled by fan-out WLP (eWLB), Portugal.

Flack et al., Lithography Technique to Reduce the Alignment Errors from Die Placement in Fan-out Wafer Level Packaging Applications, San Jose, CA.

Exposed, Merriam-Webster, merriam-webster.com/dictionary/exposed.

Thick Copper(Cu) RDL, Chipbond website.

Yannou, An overview of recent panel-scale packaging developments throughout the industry, MiNaPAD conference, Grenoble, Apr. 24, 2012.

WLCSP (FiWLP Technology), Wafer level chip scale package.

* cited by examiner

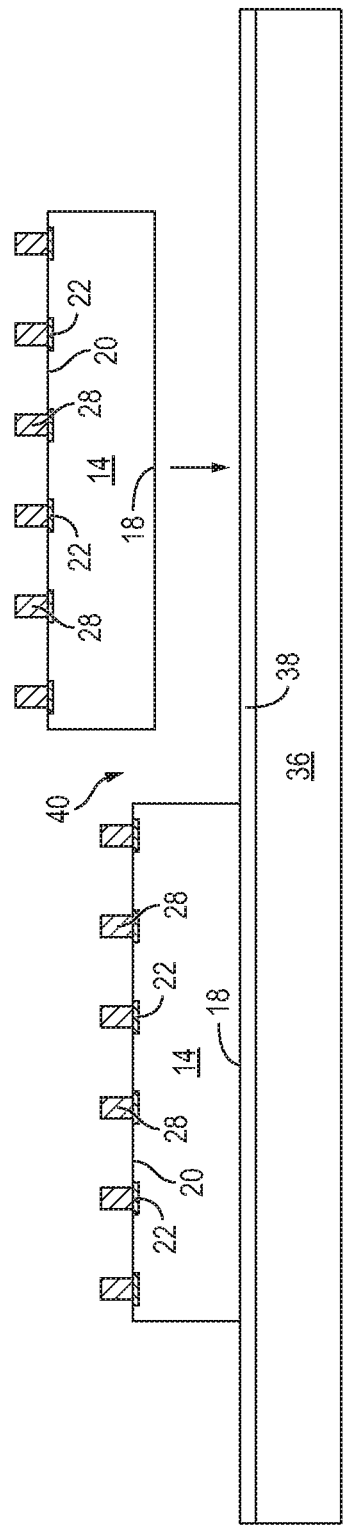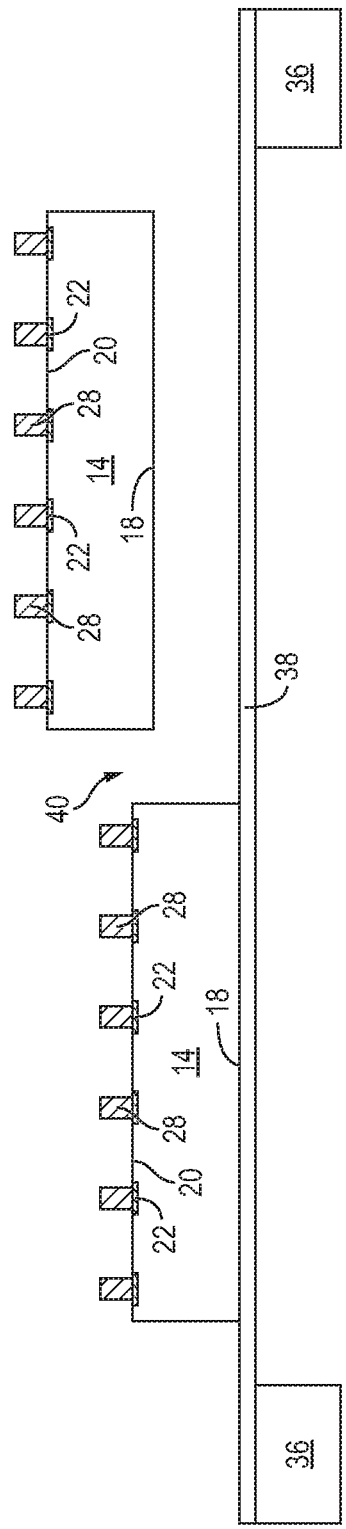

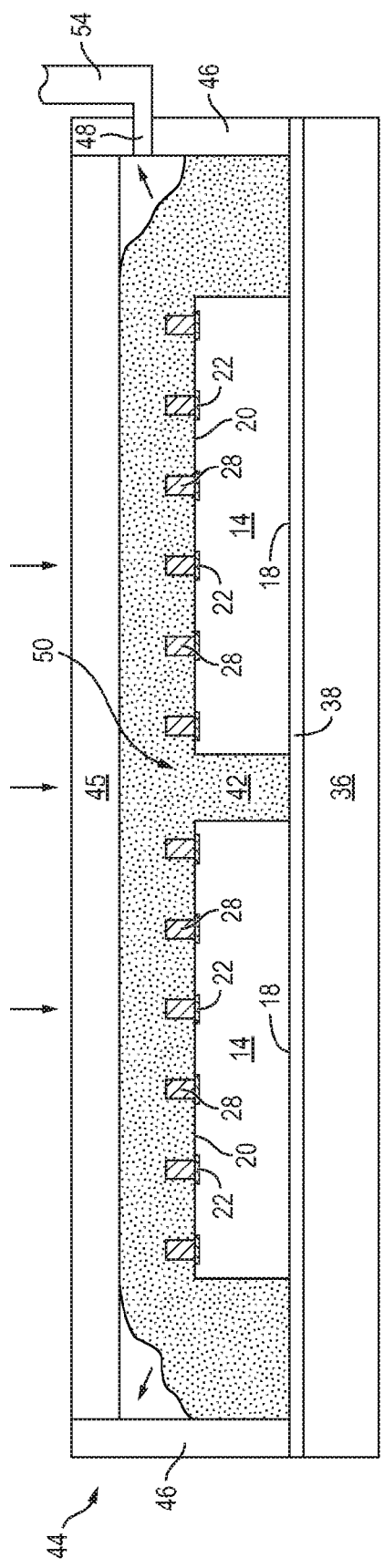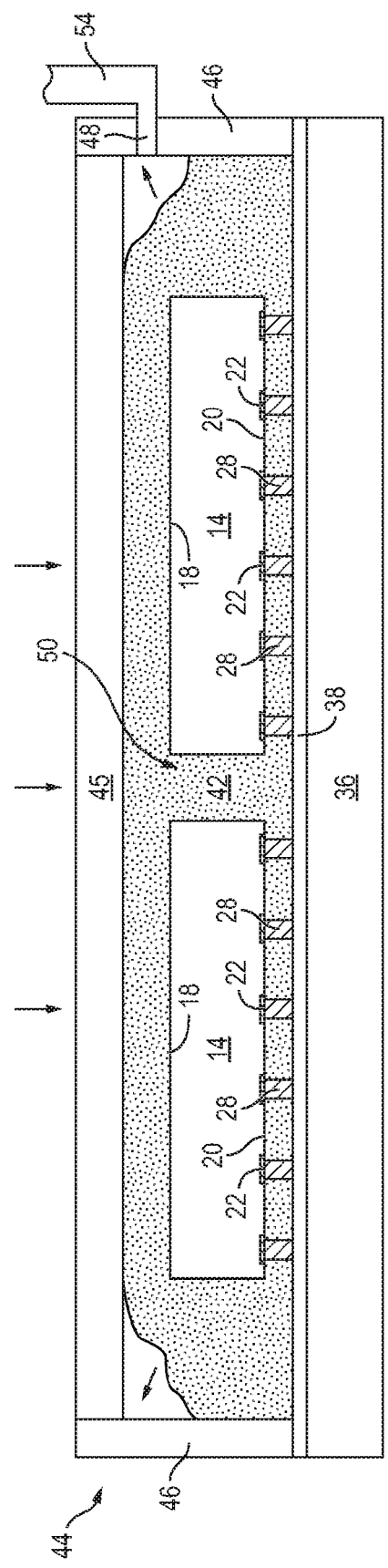

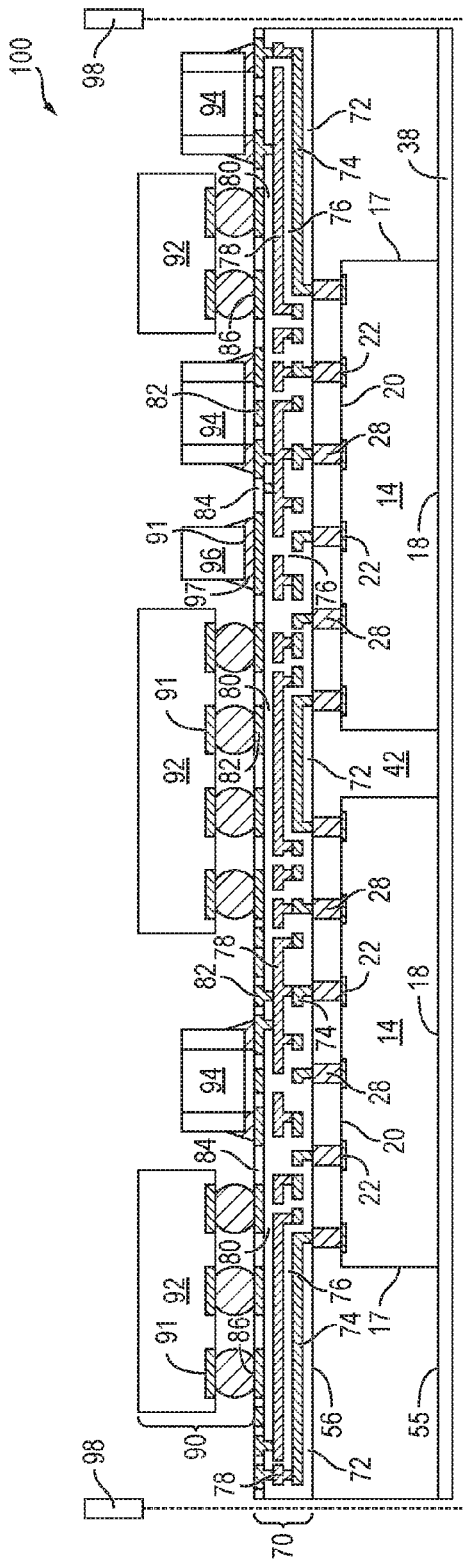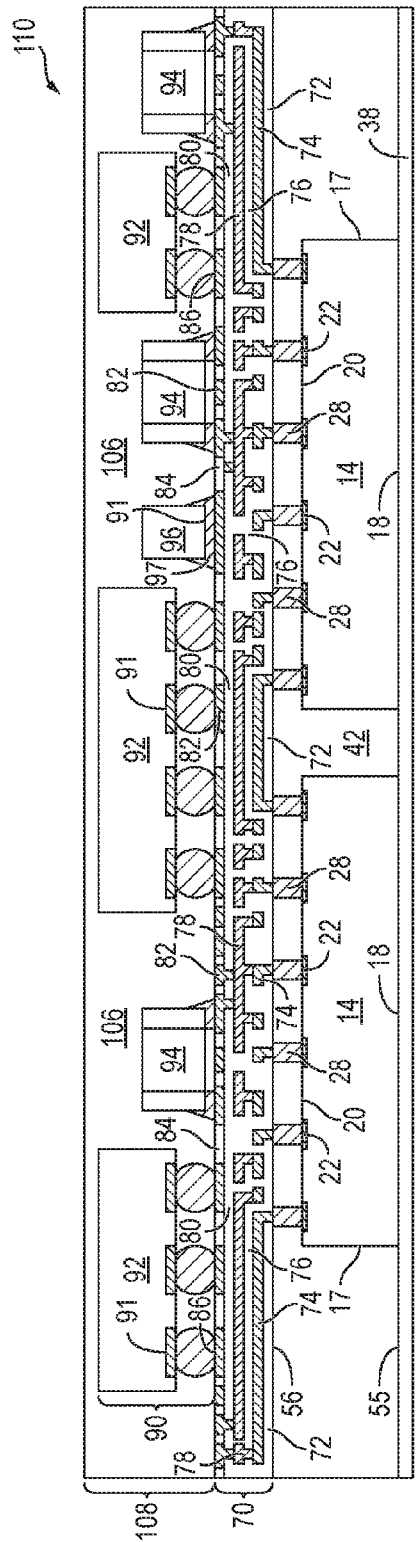

FULLY MOLDED MINIATURIZED SEMICONDUCTOR MODULE

CROSS-REFERENCE TO RELATED APPLICATIONS

This application claims the benefit, including the filing date, of U.S. Provisional Patent No. 62/258,040, entitled "Fully Molded Miniaturized Semiconductor Module," which was filed on Nov. 20, 2015, the disclosure of which is hereby incorporated herein by this reference. This application is also a continuation in part of U.S. application Ser. No. 14/930,514 entitled "Semiconductor Device and Method Comprising Redistribution Layers," which was filed on Nov. 2, 2015, which is a continuation in part of application Ser. No. 14/642,531 entitled "Semiconductor Device and Method Comprising Thickened Redistribution Layers," which was filed on Mar. 9, 2015, which application claims the benefit of U.S. Provisional Patent No. 61/950,743, entitled "Wafer-Level-Chip-Scale-Packages with Thick Redistribution Layer Traces," which was filed on Mar. 10, 2014, and further is also a continuation in part of U.S. application Ser. No. 14/584,978, entitled "Die Up Fully Molded Fan-Out Wafer Level Packaging," which was filed on Dec. 29, 2014, which application is a continuation of U.S. application Ser. No. 14/024,928, entitled "Die Up Fully Molded Fan-Out Wafer Level Packaging," which was filed on Sep. 12, 2013, now issued as U.S. Pat. No. 8,922,021, which application is a continuation of U.S. application Ser. No. 13/632,062, entitled "Die Up Fully Molded Fan-Out Wafer Level Packaging," which was filed on Sep. 30, 2012, now issued as U.S. Pat. No. 8,535,978, which application is a continuation in part of U.S. application Ser. No. 13/341,654, entitled "Fully Molded Fan-Out," which was filed on Dec. 30, 2011, now issued as U.S. Pat. No. 8,604,600, and claims the benefit of the filing date of U.S. Provisional Patent No. 61/672,860, entitled "Fan-Out Semiconductor Package," which was filed on Jul. 18, 2012, the disclosures of which are hereby incorporated herein by this reference.

TECHNICAL FIELD

The disclosure relates to fully molded semiconductor packages, and more particularly to fully molded fan-out miniaturized modules, fully molded fan-out modules (FM-FOM), or miniaturized modules (hereinafter "module" or "modules"). The modules can comprise a plurality of integrated semiconductor devices for wearable technology, for the internet-of-things (IoT) devices, or both.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically designed to be identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Back-end processing of semiconductor die includes a number of surface mount technologies (SMT) that are used to connect semiconductor die or integrated circuits to surfaces of substrates and PCBs without the use of through holes in the PCBs. Quad Flat Packages (QFP) use SMT that includes leads that extend from each of the four sides of the package, sometimes referred to as "gull wing leads." QFP leads provide electrical Input/Output (I/O) interconnection between the semiconductor die within the package and the PCB or substrate to which the QFP is mounted. Other SMT packages are made without leads and are commonly referred to flat no lead packages. Examples of flat no lead packages are Quad-flat no leads packages (QFNs) and dual-flat no lead (DFN) packages. QFN packages conventionally include a semiconductor die connected by wirebonds to a leadframe that is used for package I/O interconnection.

SUMMARY

On opportunity exists for improved semiconductor manufacturing. Accordingly, in one aspect, a semiconductor module can comprise a fully molded base portion comprising a planar surface that further comprises a semiconductor die comprising contact pads, conductive pillars coupled to the contact pads and extending to the planar surface, and an encapsulant material disposed over the active surface, four side surfaces, and around the conductive pillars, wherein ends of the conductive pillars are exposed from the encapsulant material at the planar surface of the fully molded base portion. A build-up interconnect structure comprising a routing layer can be disposed over the fully molded base portion. A photo-imageable solder mask material can be disposed over the routing layer and comprise openings to form surface mount device (SMD) land pads electrically coupled to the semiconductor die and the conductive pillars. A SMD component can be electrically coupled to the SMD land pads with surface mount technology (SMT).

The semiconductor module can further comprise the photo-imageable solder mask comprising at least one of epoxy solder resist, polyimide, PBO, and silicone. The SMD component can be electrically coupled to the SMD land pads, wherein the SMD component can comprise solderable terminations, the solder paste can be disposed over the SMD land pads, and the solderable terminations can be disposed over, and electrically coupled to, the SMD land pads while the solderable terminations are in contact with the solder paste. The SMD land pads can comprise a solderable surface finish of nickel (Ni) and gold (Au), or Ni, palladium (Pd) and Au, or tin (Sn), or solder, or an Organic Solderability Preservative (OSP). The SMD component can be coupled to the land pads with solder bumps. The build-up interconnect structure can comprises high-density multilayer routing layers. The SMD component can be partially within a footprint of the semiconductor die and partially without a footprint of the semiconductor die, and at least one of the SMD land pads can be positioned over an edge of the footprint of the semiconductor die within the fully molded structure. A first output connector of the module can be adapted to be coupled to a battery, and a second connector of the module can be adapted to be coupled to a display. The semiconductor die in the fully molded base portion can be fully testable before any SMD component is coupled to the SMD land pads.

In another aspect, a semiconductor module, can comprise a fully molded base portion comprising a planar surface, the base portion further comprising a semiconductor die comprising contact pads, conductive pillars coupled to the contact pads and extending to the planar surface, and an encapsulant material disposed over the active surface, four side surfaces, and around the conductive pillars, wherein ends of the conductive pillars are exposed from the encapsulant material at the planar surface of the fully molded base portion. A build-up interconnect structure can comprise a routing layer disposed over the fully molded base portion. A SMD component can be electrically coupled to the routing layer.

The semiconductor module can further comprise the SMD component being electrically coupled to the routing layer. The SMD component can comprise solderable terminations, a solder paste can be disposed over the routing layer, and the solderable terminations can be disposed over, and electrically coupled to, the routing layer when the solderable terminations are in contact with the solder paste. The SMD component can be coupled to the routing layer with solder bumps. The SMD component can be partially within a footprint of the semiconductor die and partially without a footprint of the semiconductor die. A first output connector of the module can be adapted to be coupled to a battery, and a second connector of the module can be adapted to be coupled to a display. The semiconductor die in the fully molded base portion can be fully testable before any SMD component is coupled to the SMD land pads.

In another aspect, a method of making a semiconductor module can comprise forming electrical interconnects on a semiconductor die, and encapsulating the semiconductor die with an encapsulant to form a first embedded portion with the electrical interconnects exposed from the encapsulant. A build-up interconnect structure can be formed comprising a conductive RDL layer over the first embedded portion and electrically connected to the electrical interconnects. Surface mount device (SMD) land pads can be formed electrically coupled to the conductive RDL layer. A SMD component can be coupled to the SMD land pads with surface mount technology (SMT) to provide an electrical connection between the SMD component and the semiconductor die through the conductive pillars and the build-up interconnect structure.

The method of making a semiconductor module can further comprise forming the SMD land pads by disposing a photo-imageable solder mask material over the conductive RDL layer, forming openings in the photo-imageable solder mask material over the conductive RDL layer, and applying a solderable surface finish of Ni and Au; Ni, Pd and Au; Sn; solder; or OSP over the SMD land pads. Coupling the SMD component to the SMD land pads can further comprise screen printing solder paste over each of the SMD land pads, placing solderable terminations of the SMD components over the first embedded portion such that solderable terminations contact the solder paste over the SMD land pads, and reflowing the solder paste to couple the SMD components to the SMD land pads. The semiconductor die can be electrically tested within the first embedded portion before coupling any of the SMD components to the first embedded portion. The method can further comprise coupling the SMD component to the SMD land pads so that the SMD component is partially within a footprint of the semiconductor die and partially without a footprint of the semiconductor die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 2A-2K illustrate various aspects of formation of semiconductor modules, modules, or semiconductor die modules.

DETAILED DESCRIPTION

Figure 1A:
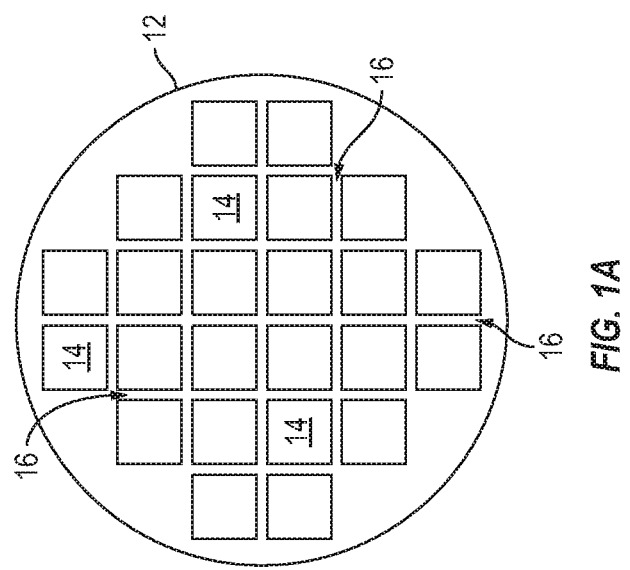
FIGS. 1A-1D illustrate a native wafer or substrate comprising a plurality of semiconductor die and conductive interconnects formed over the plurality of semiconductor die.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and micrholithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIGS. 1A-1D show a plurality of semiconductor die that have been formed according to front-end manufacturing methods and procedures as outlined above. More specifically, FIG. 1A shows a semiconductor wafer 10 with a base substrate material 12, such as, without limitation, silicon, germanium, gallium arsenide, indium phosphide, or silicon carbide, for structural support. A plurality of semiconductor die or components 14 is formed on wafer 10 separated by a non-active, inter-die wafer area or saw street 16 as described above. Saw streets 16 provide cutting areas to singulate semiconductor wafer 10 into individual semiconductor die 14.

Figure 1B:
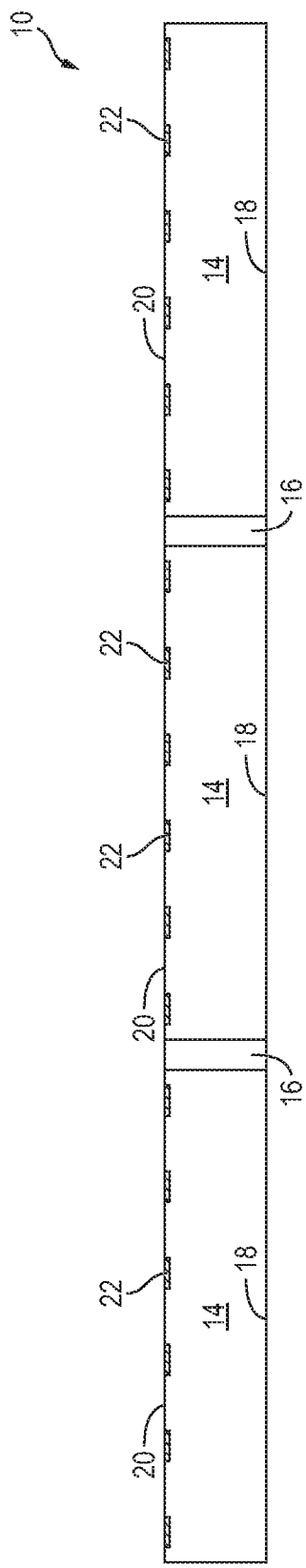

FIG. 1B shows a cross-sectional profile view of a plurality of semiconductor die 14 from the native semiconductor wafer 10, shown in FIG. 1A. Each semiconductor die 14 has a backside or back surface 18 and an active surface 20 opposite the backside. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuits. Semiconductor die 14 may also contain IPDs such as inductors, capacitors, and resistors, for RF signal processing.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), tin (Sn), nickel (Ni), gold (Au), silver (Ag), or other suitable electrically conductive material. Conductive layer 22 operates as contact pads or bond pads electrically coupled or connected to the circuits on active surface 20. Conductive layer 22 can be formed as contact pads disposed side-by-side a first distance from the edge of semiconductor die 14, as shown in FIG. 1B. Conductive layer 22 can also be formed as contact pads that are offset in multiple rows such that a first row of contact pads is disposed a first distance from the edge of the die, and a second row of contact pads alternating with the first row is disposed a second distance from the edge of the die. Additionally, conductive layer 22 can be formed as contact pads that are arranged as a full array of pads distributed over the active area of the semiconductor die or chip. In some instances the contact pads can be arranged in an irregular or asymmetrical array with differing or various spacing among the contact pads.

Figure 1C:
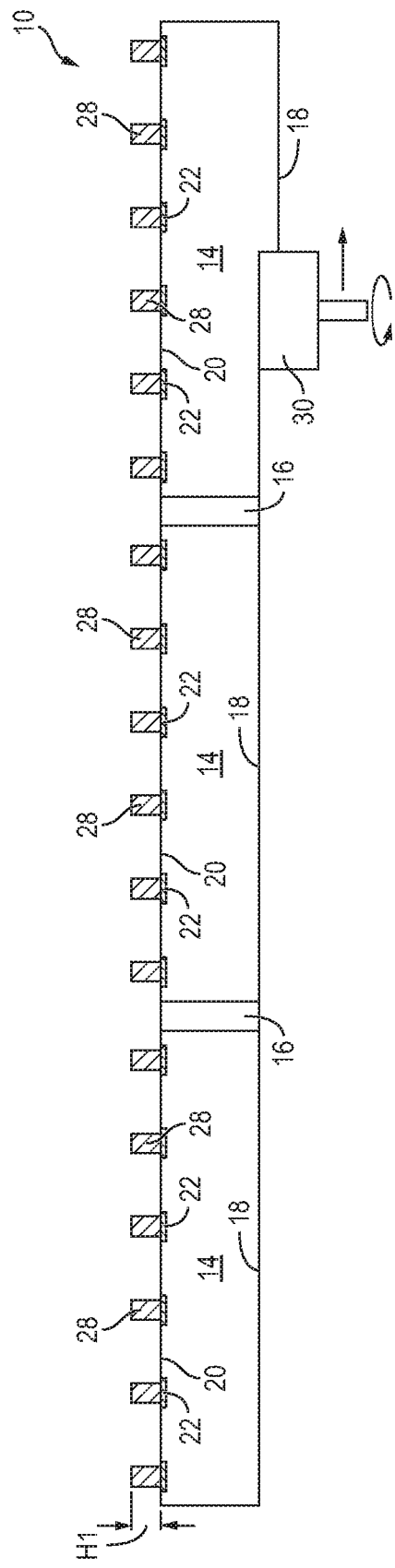

FIG. 1C shows an optional insulating or passivation layer 26 conformally applied over active surface 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide (SiO2), silicon nitride (Si3N4), silicon oxynitride (SiON), tantalum pentoxide (Ta2O5), aluminum oxide (Al2O3), polymer, polyimide, benzocyclobutene (BCB), polybenzoxazoles (PBO), or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1C also shows electrical interconnect structures 28 can be formed as columns, pillars, posts, studs, bumps, formed of a suitable conductive material, such as copper, and are disposed over, and coupled or connected to, conductive layer 22. Interconnect structures 28 can be formed directly on conductive layer 22 using patterning and metal deposition processes such as printing, PVD, CVD, sputtering, electrolytic plating, electroless plating, metal evaporation, metal sputtering, or other suitable metal deposition process. Interconnect structures 28 can be one or more layers of Al, Cu, Sn, Ni, Au, Ag, palladium (Pd), or other suitable electrically conductive material and can include one or more UBM layers. In an embodiment, a photoresist layer is deposited over semiconductor die 14 and conductive layer 22. A portion of photoresist layer is exposed and removed by an etching development process. Electrical interconnect structures 28 are formed as copper pillars in the removed portion of the photoresist and over conductive layer 22 using a selective plating process. The photoresist layer is removed leaving interconnect structures 28 that provide for subsequent mechanical and electrical interconnection and a stand-off with respect to active surface 20 and insulating layer 26, if present. Interconnect structures 28 can include a height H1 in a range of 10-100 micrometers (μm) or a height in a range of 20-50 μm, or a height of about 35 μm.

FIG. 1C further shows wafer 10 undergoes an optional grinding operation with grinder 30 to planarize back surface 18 and reduce a thickness of the wafer. A chemical etch can also be used to remove and planarize a portion of wafer 10.

Figure 1D:
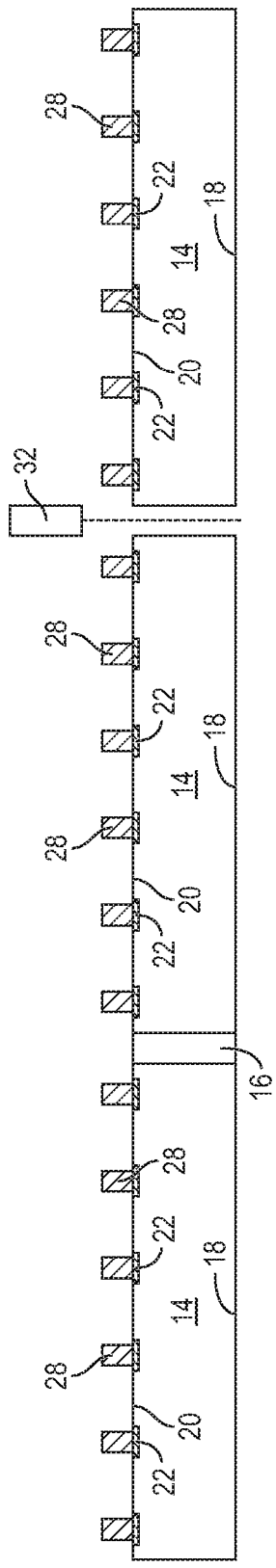

FIG. 1D shows after the formation of interconnect structures 28 and the optional grinding of wafer 10, wafer 10 is singulated through saw streets 16 using a saw blade or laser cutting tool 32 into individual semiconductor die 14.

FIG. 2A shows a carrier or substrate 36 containing temporary or sacrificial base material such as silicon, polymer, stainless steel, or other suitable low-cost, rigid material for structural support. An optional interface layer or double-sided tape 38 is formed over carrier 36 as a temporary adhesive bonding film or etch-stop layer. In an embodiment, carrier 36 is a ring-shaped film frame comprising an open center portion that supports tape 38 at a periphery of the tape as shown in FIG. 2B.

FIG. 2A further shows semiconductor die 14 from FIG. 1D mounted face up or die up to carrier 36 and interface layer 38 with backside 18 oriented towards the substrate and active surface 20 oriented away from the carrier 36. As used herein, face up or die up refers to a semiconductor die comprising an active surface and a back surface opposite the active surface that is positioned such that the back surface is coupled to, the carrier. The active surface of the semiconductor die can be oriented away from the carrier when the semiconductor die is mounted to the carrier. As used herein, face down or die down refers to a semiconductor die comprising an active surface and a back surface opposite the active surface that is positioned such that the active surface is coupled to, and oriented towards, the carrier and the back surface of the semiconductor die is oriented away from the carrier when the semiconductor die is mounted to the carrier. Semiconductor die 14 can be placed over carrier 36 using a pick and place operation or other suitable operation. An adhesive 41 is optionally disposed between backside 18 of semiconductor die 14 and carrier 36. Adhesive 41 can be thermal epoxy, epoxy resin, B-stage epoxy film, ultraviolet (UV) B-stage film with optional acrylic polymer, or other suitable material. In an embodiment, adhesive 41 can be disposed over backside 18 before semiconductor die 14 are mounted over carrier 36. Alternatively, adhesive 41 can be disposed on carrier 36 before mounting the semiconductor die to the carrier. In other embodiments, as shown in FIG. 2B, semiconductor die 14 can be mounted directly to interface layer or support tape 38 without use of adhesive 41.

Semiconductor die 14 are mounted to carrier 36 such that the semiconductor die are separated by a space or gap 40 when mounted over carrier 36 that provides an area for a subsequently formed fan-out interconnect structure including bussing lines. A size of gap 40 includes sufficient area for optionally mounting semiconductor devices or components within the subsequently formed FOWLPs.

FIG. 2C shows an encapsulant or mold compound 42 that can be formed of a polymer composite material, such as epoxy resin with filler, epoxy acrylate with filler, polymer with proper filler, or other suitable material. Encapsulant 42 can be non-conductive, provide physical support, and environmentally protect the semiconductor die 14 from external elements and contaminants. The encapsulant 42 can be deposited using a paste printing, compression molding, transfer molding, liquid encapsulant molding, lamination, vacuum lamination, spin coating, or other suitable applicator. Specifically, FIG. 2C shows a mold 44 with a plurality of sidewalls 46 brought together with top portion or plate 45, carrier 36, and interface layer 38 to enclose semiconductor die 14 within the mold for subsequent encapsulation. Mold 44 can also include a bottom portion on which carrier 36 is placed and to which sidewalls 46 can be in contact. In an embodiment, carrier 36 and interface layer 38 serve as the bottom mold portion for the subsequent encapsulation process. Alternatively, semiconductor die 14, carrier 36, and interface layer 38 may be disposed within a mold including multiple portions, such as top and bottom portions. Mold 44 is brought together by moving mold 44 around semiconductor die 14, or alternatively, by moving the semiconductor die into the mold.

FIG. 2C further shows mold 44 encloses semiconductor die 14 with a cavity or open space 50. Cavity 50 extends between mold 44 to semiconductor die 14 and interface layer 38. A volume of encapsulant 42 is disposed over semiconductor die 14 and carrier 36. Inlet 48 can be an exhaust port with optional vacuum assist 54 for providing a vacuum in cavity 50; however, inlet 48 does not provide an escape path for encapsulant 42. Encapsulant 42 can be a polymer composite material, such as epoxy resin with filler, epoxy acrylate with filler, or polymer with proper filler. The volume of encapsulant 42 is measured according to the space requirements of cavity 50 less the area occupied by semiconductor die 14 and any additional semiconductor devices that might be present. Encapsulant 42 is disposed over semiconductor die 14 and between sidewalls 46. Top portion 45 of mold 44 moves along sidewalls 46 toward encapsulant 42 and semiconductor die 14 until the top portion contacts the encapsulant to evenly disperse and uniformly distribute encapsulant 42 within cavity 50 around semiconductor die 14. A viscosity and elevated temperature of encapsulant 42 can be selected for uniform coverage, for example, a lower viscosity and elevated temperature can increase the flow of the encapsulant for molding, paste printing, and spin coating. The temperature of encapsulant 42 can also be controlled within cavity 50 to promote curing of the encapsulant. Semiconductor die 14 are embedded together in encapsulant 42, which is non-conductive and environmentally protects the semiconductor device from external elements and contaminants.

Figure 2E:
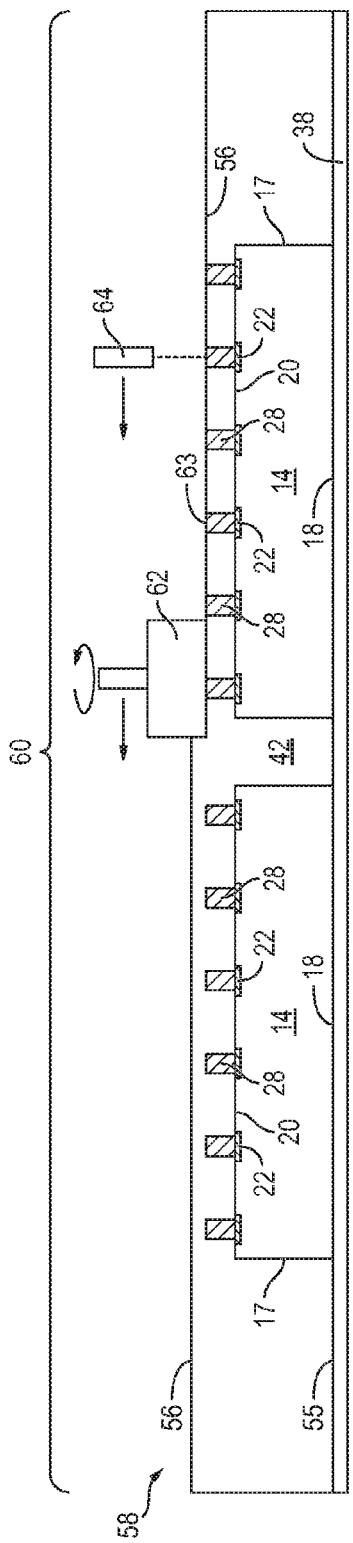

FIG. 2D shows an encapsulation process similar to the process described in relation to FIG. 2C. FIG. 2D differs from FIG. 2C by the orientation of semiconductor die 14 relative to carrier 36 and interface layer 38. Instead of mounting semiconductor die 14 face up with active surface 20 oriented away from carrier 36 as shown in FIG. 2C, FIG. 2D shows an embodiment in which semiconductor die 14 are mounted face down with active surface 20 oriented toward carrier 36. Accordingly, adhesive 41 can be omitted from over back surface 18 of semiconductor die 14. Furthermore, while the processing shown subsequently in FIGS. 2E-2K is shown with respect to the packaging of semiconductor die 14 illustrated in FIG. 2C, the subsequent processing is likewise applicable to the packaging illustrate in FIG. 2D.

FIG. 2E shows a cross-sectional profile view of the encapsulant 42 disposed around the semiconductor die 14 to form the embedded die panel, molded panel, or panel 58. The panel 58 can comprise a footprint or form factor of any shape such as circular, square, and rectangular, and further comprises a size that allows for, and facilitates, subsequent processing. In some instances, the panel 58 can include a form factor similar to the form factor of a 300 millimeter (mm) semiconductor wafer and includes a circular footprint having a diameter of 300 mm, although other sizes are also possible. The panel 58 can comprise a plurality of portions or first embedded portions 60 that can be used for a plurality of subsequently formed semiconductor modules 100, each of which undergoes processing at a same time on the panel 58. Thus, while for simplicity only two semiconductor die 14 are shown in FIGS. 2E-2K, which can form part of a single semiconductor module 100, a person of ordinary skill in the art will understand that many more semiconductor die 14 and first embedded portions 60 can be included in, and formed from, the panel 58. The first embedded portions 60 can also be referred to, and understood as, a fully molded base portion, an embedded portion, an embedded die, a base portion, or a first portion. The first embedded portions 60 of the panel 58 can, in addition to comprising one or more semiconductor die 14, further comprise integrated circuits (ICs), passive devices, wafer level chip scale packages (WLCSPs) and other components.

Figure 2F:
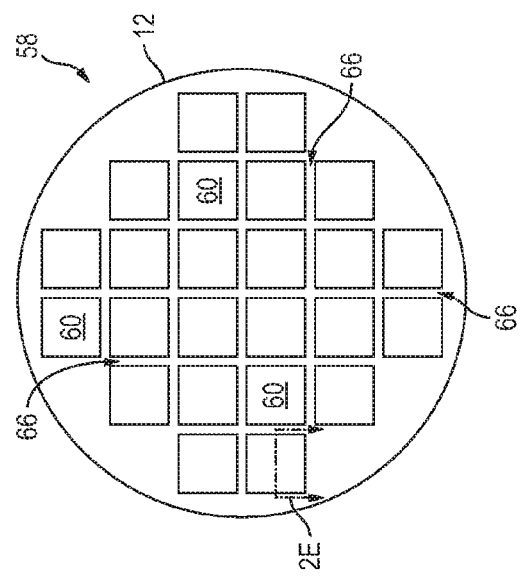

Consistent with the foregoing, FIG. 2F shows a plan view of the panel 58, comprising a plurality of first embedded portions 60. FIG. 2F also shows a cross-section line 2E on the panel 58, from which the cross-sectional view in FIG. 2E for a single first embedded portion 60 is taken.

In FIG. 2E, semiconductor die 14 are removed from mold 44, and an embedded die panel or panel 58 optionally undergoes a curing process to cure encapsulant 42. Carrier 36 and interface layer 38 are optionally removed by chemical etching, mechanical peeling, CMP, mechanical grinding, thermal bake, UV light, laser scanning, or wet stripping to expose encapsulant 42. Alternatively, the carrier 36 and the interface layer 38 can remain for subsequent processing and removed at a later time. In some instances, interface layer 38, like adhesive 41, can remain over the semiconductor die 14 and the encapsulant 42 to become part of a final module structure. For example, the interface layer 38 can be formed as a back-side coating formed of epoxy laminate or other suitable material to encapsulate the backside 18 of the semiconductor die 14 and form a backside or outer surface of the semiconductor module 100. When formed as a backside coating, the interface layer 38 can be formed at any suitable time during the formation of the semiconductor module 100. As such, the final module can comprise the interface layer 31, the adhesive 41, or both. A first surface 55 of encapsulant 42 can be substantially coplanar with one or more of the backside 18 of semiconductor die 14, adhesive 41, and interface layer 38. The first surface 55 of the encapsulant 42 can be substantially coplanar with the backside 18, the encapsulant 42 being exposed by the removal of carrier 36 and interface layer 38.

FIG. 2E also shows panel 58 can undergo an optional grinding operation with grinder 62 to planarize the second surface 56 of encapsulant 42, which is opposite the first surface 55, and to reduce a thickness of the panel 58 or the first embedded portion 60. A chemical etch can also be used to remove and planarize a portion of encapsulant 42 in panel 58, such as the second surface 56. Thus, a surface 63 of interconnect structures 28 can be exposed with respect to surface 56 of the encapsulant 42, or at an edge of panel the 58, to provide for electrical connection between semiconductor die 14 and a subsequently formed build-up interconnect structure or fan-out interconnect structure 70.

FIG. 2E also shows that actual positions of the semiconductor die 14 within the reconstituted panel 58 can be measured with an inspection device or optical inspection device 64. As such, subsequent processing of the fully molded panel 58 as shown and described with respect to subsequent FIGs. can be performed with respect to the actual positions of the semiconductor die 14 within the reconstituted panel 58.

As noted above, FIG. 2F shows a plan view of the panel 58. FIG. 2F also shows that the panel 58 can comprise a plurality of saw streets or inter-module areas 66, which can be disposed between and extend along first embedded portions 60, similar to the way in which saw streets 16 separate semiconductor die 14 in their native semiconductor wafers 10.

Figure 2G:
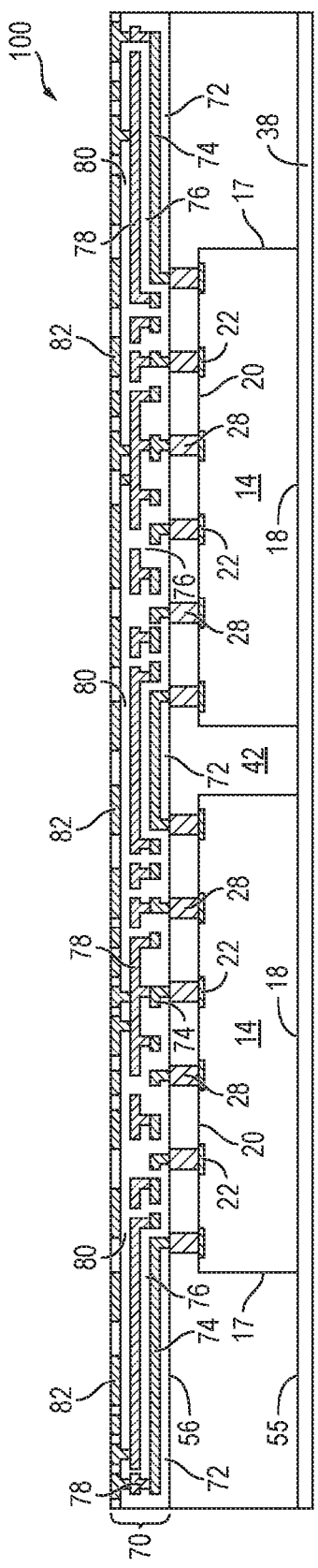

FIG. 2G shows forming a build-up interconnect structure 70 over the molded panel 58 to electrically connect, and provide routing with respect to, conductive interconnects 28. As such, the build-up interconnect structure 70 can comprise high-density multilayer routing layers. While the build-up interconnect structure 70 is shown comprising three conductive layers 74, 78, 82 and three insulating layers 72, 76, 80 a person of ordinary skill in the art will appreciate that fewer layers or more layers can be used depending on the configuration and design of the semiconductor modules 100.

The build-up interconnect structure 70 can optionally comprise a first insulating or passivation layer 72 formed or disposed over the reconstituted panel 58. The first insulating layer 72 can comprise one or more layers of $SiO_2$, $Si_3N_4$, SiON, $Ta_2O_5$, $Al_2O_3$, or other material having similar insulating and structural properties. The insulating layer 72 can be formed using PVD, CVD, printing, spin coating, spray coating, sintering or thermal oxidation. Openings or first level vias can be formed through the insulating layer 72 over the interconnect structures 28 to connect with the semiconductor die 14. In some instances the opening or first level via can be filled with conductive material or formed as a first level conductive via before the formation of a first electrically conductive layer 74. Alternatively, the first level via can be filled with conductive material and be formed as the first level conductive via with, and at a same time as, the formation of the first electrically conductive layer 74.

The first conductive layer or routing 74 can be formed over the reconstituted panel 58 and over the first insulating layer 72 as a first RDL layer to extend through the openings in the first insulating layer 72, to electrically connect with the first level conductive vias, and to electrically connect with electrical interconnect structures 28. Conductive layer 74 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating or passivation layer 76, which can be similar or identical to the first insulating layer 72, can be disposed or formed over the reconstituted panel 58, the first conductive layer 74, and the first insulating layer 72. An opening or second level via can be formed through the second insulating layer 76 to connect with the first conductive layer 74. In some instances the opening or second level via can be filled with conductive material or formed as a second level conductive via before the formation of a second electrically conductive layer 78. Alternatively, the second level via can be filled with conductive material and be formed as the second level conductive via with, and at a same time as, the formation of the second electrically conductive layer 78.

A second conductive layer or routing layer 78, which can be similar or identical to the first conductive layer 74, can be formed as a second RDL layer over the reconstituted panel 58, over the first insulating layer 72, over the first conductive layer 74, over the second level conductive via, or within an opening of the second insulating layer 72, to electrically connect with the first conductive layer 74, the first level and second level conductive vias, the electrical interconnect structures 28, and the semiconductor die 14.

A third insulating or passivation layer 80, which can be similar or identical to the first insulating layer 72, can be disposed or formed over the second conductive layer 78 and the second insulating layer 76. An opening or a third level via can also be formed in or through the third insulating layer 80 to connect with the second conductive layer 78. In some instances the opening or third level via can be filled with conductive material or formed as a third level conductive via before the formation of a third electrically conductive layer 82. Alternatively, the third level via can be filled with conductive material and be formed as the third level conductive via with, and at a same time as, the formation of the third electrically conductive layer 82.

The third conductive layer or routing layer 82 can be formed over the third insulating layer 80 to electrically connect with the other conductive layers and conductive vias within the build-up interconnects structure 70, as well as electrically connect to the semiconductor die 14 and the electrical interconnect structures 28. Conductive layer 82, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), Pd, TiW, or chromium copper (CrCu). In some instances the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstroms). The seed layer can be formed over the barrier layer and can act as an intermediate conductive layer below subsequently placed surface mount device (SMD) components or devices 90. In some instances, the wetting layer can comprise a layer of Cu with a thickness in a range of about 5-11 μm or 7-9 μm. Subsequently placed SMD components 90, such as those shown in FIG. 2H, can comprise solder such as SnAg solder, which can consume some of the Cu of conductive layer 84 during reflow and forms an intermetallic compound at an interface between the solder and the Cu of the wetting layer. However, the Cu of the wetting layer can be made thick enough to prevent full consumption of the Cu pad by the solder during high temperature aging.

A photo-imageable solder mask material 84 can be disposed over, around, or both over and around, the build-up interconnect structure 70 and one or more of the conductive routing layers 74, 78, or 82, such as a top routing layer. While the number of conductive routing layers within the build-up interconnect structure can vary, as a person of ordinary skill in the art will appreciate, placement of the photo-imageable solder mask material 84 is described without limitation with respect to the conductive routing layer 82. The photo-imageable solder mask material 84 can comprise epoxy, solder resist, polyimide, PBO, silicone, or other similar or suitable material. The photo-imageable solder mask material 84 can comprise openings around the conductive routing layer 78 to form surface mount device (SMD) land pads 86, which can be electrically coupled to the semiconductor die 14 and the conductive pillars 28, such as through the build-up interconnect structure 70. The SMD land pads 86 can further comprise a solderable surface finish of Ni and Au; Ni, Pd, and Au; Sn; solder; Organic Solderability Preservative (OSP); or other suitable material. In some instances the solder mask material 84 and the SMD land pads 86 can be formed as part of the build-up interconnect structure 70.

With the build-up interconnect structure 70 formed over the embedded die panel 58 and the embedded portions 60, the semiconductor die 14 embedded in the fully molded base portion 60 can be fully testable before any SMD components 90 are coupled to the SMD land pads 86. Similarly, the semiconductor die 14 embedded in the fully molded base portion 60 can also be fully testable before the build-up interconnect structure 70 formed over the embedded die panel 58 and the embedded portions 60, including after electrical interconnect structures 28 are formed over the semiconductor wafer 10 but before the formation of the embedded die panel 58. As used herein, fully testable includes the ability to test components, such as semiconductor die 14 and the build-up interconnect structure 70, for proper electrical connection, interconnection, and function, and to ensure undesired defects such as bridging or low quality performance are present due to defects.

When positions of semiconductor die 14 and interconnect structures 28 shift from nominal positions such as during placement and encapsulation of the semiconductor die 14 for formation of panel 58, the true or actual positions of the semiconductor die 14 may not sufficiently align with the nominal design of the fan-out interconnect structure to provide desired reliability for package interconnections given desired routing densities and pitch tolerances. When shifts in the positions of semiconductor die 14 are small, no adjustments to the positions of openings in insulating layer 72 or the positioning or arrangement of conductive layer 74 may be required to properly align with the interconnect structures 28. However, when changes in the positions of semiconductor die 14 and interconnect structures 28 are such that the nominal position does not provide adequate alignment with, and exposure to, the interconnect structures 28, then adjustments to the position of openings in insulating layer 72 and the positioning and arrangement of conductive layer 74 can be made by unit specific patterning, module specific patterning, or Adaptive Patterning™ (hereinafter "unit specific patterning") as described in greater detail in U.S. patent application Ser. No. 13/891,006, filed May 9, 2013, now U.S. Pat. No. 9,196,509, the disclosure of which is hereby incorporated by reference. Unit specific patterning can optionally adjust the position of openings 66 for each semiconductor die 14 individually, or can adjust positions for a number of semiconductor die 14 simultaneously. The position, alignment, or position and alignment of openings in insulating layer 72 and the position and arrangement of conductive layer 74 can be adjusted by an x-y translation or by rotation of an angle θ with respect to their nominal positions or with respect to a point of reference or fiducial on panel 58.

In some instances, a 2D code can be optionally formed within the build-up interconnect layer 70, such as an electrically functional RDL layer or one or more of the conductive layers 74, 78, 82, that uniquely identify each semiconductor die 14, first embedded portion 60, or one or more SMD components 90 within the semiconductor module 100. The unique 2D code can be formed as described in U.S. patent application Ser. No. 14/836,525 titled, "Front Side Package-Level Serialization for Packages Comprising Unique Identifiers" filed Aug. 26, 2015, now U.S. Pat. No. 9,520,364, the entirety of which is incorporated herein by this reference.

Figure 2H:
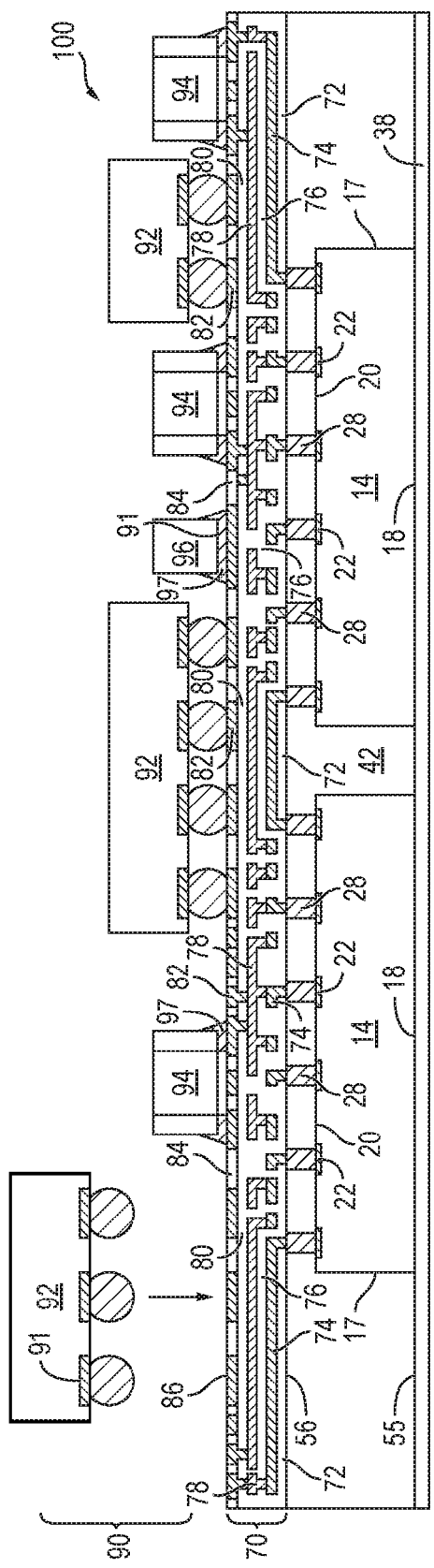

FIG. 2H shows a plurality of SMD components 90 electrically coupled to the SMD land pads 86 with SMT. The SMD components 90 can comprise terminals or contact pads 91 for interconnection or electrical interconnection between the SMD components 90 and the SMD land pads 86. The SMD components 90 can comprise a variety of semiconductor die, wafer level chip scale packages (WLCSPs), or ICs 92, surface mount devices or active devices 94, and passive devices 96 including solderable passives such as resistors or capacitors, as well as other components, which can be mounted to the first embedded portion 60 and adapted or configured to be in electrical communication with the semiconductor die 14 or other devices embedded within the first embedded portion 60. By being directly mounted or connected to the first embedded portion 60, the SMD components 90 need not be mounted to, or have signals routed through, a PCB or other substrate before arriving at the first embedded portion 60. Instead, a compact semiconductor module 100 can be created that eliminates a need for a PCB or substrate to be used in interconnecting the various SMD components with the first embedded portion 60. Improved integration and reduced size of the semiconductor module 100 is well suited for miniature electronic systems such as smart watches and other IoT devices that require the smallest possible form factor.

The SMT 97 used to electrically couple the SMD components 90 to SMD land pads or flex connect 86 can include solder, solder paste, solder bumps, bumps, or balls. As indicated above, the solderable land-pads or flex connect 86 for SMT 97 can be formed as part of, or formed over and coupled to, the build-up interconnect structure 70 and multilayer routing of conductive layers 74, 78, 82, to allow for large variation in a size of SMT 97. In some instances, the SMD components 90 being electrically coupled to the SMD land pads further comprise the SMD components 90 comprising solderable terminations 91, solder paste 97 disposed over the SMD land pads 86, and the solderable terminations 91 being disposed over, and electrically coupled to, the SMD land pads 86 while the solderable terminations 91 are in contact with the solder paste 97. Similarly, in some instances at least one of the SMD components 90 coupled to the land pads 86 will be coupled with solder bumps 97.

When the SMT 97 comprises solder, the solder can be placed on SMD land pads 86 to facilitate electrical communication between the SMDs 90 and the build-up interconnect structure 70 as well as the first embedded portion 60. The solder can comprise Al, Sn, Ni, Au, Ag, Pb, Bi, Cu, solder, and combinations thereof, with an optional flux solution. For example, the solder can be eutectic Sn/Pb, high-lead solder, or lead-free solder. The solder can be deposited over the first embedded portion 60 and on the SMD land pads 68 using evaporation, electrolytic plating, electroless plating, ball drop, or screen printing process. In some embodiments, the solder is Sn solder paste that is deposited using screen printing. After the SMDs 90 are coupled to the first embedded portion 60 with the solder, the solder can undergo a reflow process or be reflowed to improve electrical contact between the SMDs 90 and the SMD land pads 58 or the first embedded portion 60. After reflow, the embedded die panel 58 or first embedded portion 60 and SMDs 90 can optionally undergo one or more of an aqueous clean, an automated optical inspection (AOI), and a plasma clean.

FIG. 2I shows that after the of SMD components 90 are mounted to the embedded die panel 58, the embedded die panel 58 can be cut or singulated through the saw streets 66 with the saw blade or laser cutting tool 98 to form semiconductor modules, modules, or semiconductor die modules 100. The semiconductor modules 100 can comprise a plurality of fully molded or encapsulated semiconductor die 14, and passives 96 together with other SMD components 90, that can be in face up positions, face down positions, or both. Thus, the semiconductor module 100 can be formed as a compact module that eliminates a need for a PCB or other substrate to be used in interconnecting the various SMD components with the first embedded portion 60. Improved integration and reduced size of the semiconductor module 100 is well suited for miniature electronic systems such as smart watches and other IoT devices that require the smallest possible form factor. In some instances, an overall size or overall dimensions of the singulated semiconductor modules 100 can comprise heights that are reduced by 10%, 20%, 30% or more from more conventional packages in which PCBs or other substrates are used for the interconnection of components on opposing sides of the packages, such as semiconductor die 14, and components 92, 94, and 96.

In addition to providing a benefit of compact size, the module 100 can also provide improved strength due to a robust design. For example, the semiconductor module 100 can comprise at least one of the SMD components 90 being partially within a footprint of one of the semiconductor die 14 and partially without a footprint of the semiconductor die 14. Additionally, at least one of the SMD land pads 86 can be positioned over an edge of the footprint of the semiconductor die 14 within the fully molded base portion 60. The addition of mold compound 42 over the face or active surface 18 of the semiconductor die 14 and over an edge 17 of the semiconductor die 14 can improve mechanical performance of the semiconductor module 100. In particular, in designs that comprise a SMD land pad 86 positioned over the edge 17 of the semiconductor die 14, the fully molded base portion 60 provides a planar second surface 56 that is mechanically isolated from the topography of the edge 17 of the semiconductor die 14. By contrast, if a face down fan-out structure were built with a fan-out structure being build-up under a semiconductor die, a SMD component could be partially mechanically coupled to the semiconductor die and partially coupled to mold compound, which could result in higher thermo-mechanical stress on a solder joint, resulting in solder joint failure.

In some instances, the build-up interconnect structure 70 can be built or formed using unit specific patterning. As such, the unit specific patterning can be used to adjust the first conductive layer 74 of the build-up interconnect structure 70 for each first embedded portion 60 within the molded panel 58 to align to the actual position of each semiconductor die 14 within each first embedded portion 60, thereby maintaining a constant alignment between the SMD land pads 86 and an outline of the module package 100.

FIG. 2J, continuing from FIG. 2I, shows that a semiconductor module, module, or semiconductor die module 110, similar to the semiconductor module 100, can be formed with the inclusion of encapsulant or mold compound 106. After the SMD components 90 are mounted to the embedded die panel 58, the SMD components 90 can be encapsulated, overmolded, or disposed within encapsulant or mold compound 106. The encapsulant or mold compound 106 can be formed of a material that is similar or identical to encapsulant 42, including a polymer composite material, such as epoxy resin with filler, epoxy acrylate with filler, polymer with proper filler, or other suitable material. Encapsulant 106 can be non-conductive, provide physical support, and environmentally protect the SMD components 90 from external elements and contaminants. The encapsulant or mold compound 106 can be deposited using a paste printing, compression molding, transfer molding, liquid encapsulant molding, lamination, vacuum lamination, spin coating, or other suitable applicator, similar or identical to the process shown and described for encapsulant 42.

A second embedded portion, fully molded top portion, embedded portion, embedded die, top portion, or second portion 108 can be formed by the SMD components 90 being encapsulated or overmolded by the encapsulant 106. The second embedded portion 108 can be opposite of, and coupled to, the first embedded portion 60, the first and second embedded portions 60 and 108 cam be interconnected by the build-up interconnect structure 70 to form a semiconductor module, module, or semiconductor die module 110. The molding of the encapsulant 106 can occur either before or after singulation by the saw blade or laser cutting tool 98 to form the semiconductor module 110.

Figure 2K:
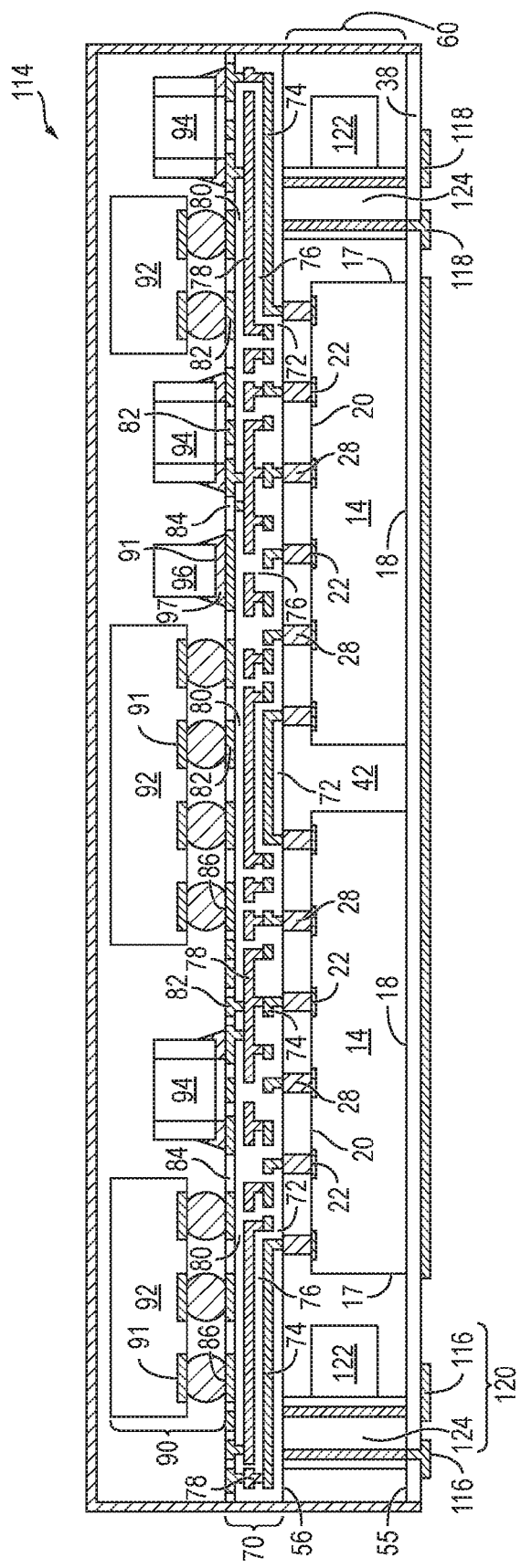

FIG. 2K shows a semiconductor module, module, or semiconductor die module 114, similar to the semiconductor module 110 shown in FIG. 2J. The module 114 shows a number of additional features that can be optionally included in addition to those shown in module 100 and module 110. For example, the semiconductor module 114 can further comprise a first set of input/output (i/o) connectors or pads 116 of the module 114, which can be adapted to be coupled to a battery, and a second set of i/o connectors or pads 118 of the module 114 being adapted to be coupled to a display or screen. In some instances the battery can be electrically connected to at least 2 terminals or pads 116 of the module 114. In some instances, a display can be electrically connected to the module 114 by way of a flexible connector. Additionally, solder balls or other suitable electrical interconnect component can be optionally attached to the module 114, such as top or bottom portions of the module 114 as i/o interconnects.

As further shown in FIG. 2K, the module 114 can also include embedded devices, passive components, or 3D interconnect components 120 integrated within a thickness of the mold compound 42 next to the semiconductor die 14 within the first embedded portion 60. In some instances, the embedded devices 120 can comprise a SMD 122 coupled to a vertical interconnect or substrate 124, which together can form the embedded devices 120. In other instances, the embedded devices could be just a SMD 122 or just a vertical interconnect 124. In some instances, the embedded devices 120 can be formed within the module 114 as disclosed in U.S. application Ser. No. 15/141,028, titled "3D Interconnect Component for Fully Molded Packages," filed Apr. 28, 2016, now U.S. Pat. No. 9,502,397, the entirety of the disclosure of which is incorporated herein by this reference.

FIG. 2K also shows that the module 114 can also comprise a shielding layer 126. Shielding layer 126 can comprise one or more conductive or metallic materials such as Al, ferrite or carbonyl iron, stainless steel, nickel silver, low-carbon steel, silicon-iron steel, foil, conductive resin, and other metals and composites capable of blocking or absorbing electromagnetic interference (EMI), radio frequency interference (RFI), harmonic distortion, and other interdevice interference. Shielding layer 126 can be patterned and conformally deposited using an electrolytic plating, electroless plating, sputtering, PVD, CVD, or other suitable deposition process. Shielding layer 126 can also be a nonmetal material such as carbon-black or aluminum flake to reduce the effects of EMI and RFI. For non-metal materials, shielding layer 126 can be applied by lamination, spraying, painting, or other suitable process. The shielding layer 126 can also be electrically connected to an external low-impedance ground point. The shielding layer 126 can be added over upper and lower portions of the module 114, and backside contact between one or more of the semiconductor die or SMT features, such as backside 18 of semiconductor die 14 can be in contact, direct contact, or coupled to the shielding layer 126. In some instances, contact between a side, surface, or backside of the one or more semiconductor die or SMT features and the shielding layer 126 can serve as a heat sink or for thermal management. The shielding layer 126 can optionally be formed as conformal EMI shielding that can cover all or most of the top and side surfaces of the module 114, including 90-100% of the top and side surfaces, and in some instances the shielding layer 126 can also cover more than 50% of a sixth side of the module 114, such as a bottom side of the module 114.

Figure 3:
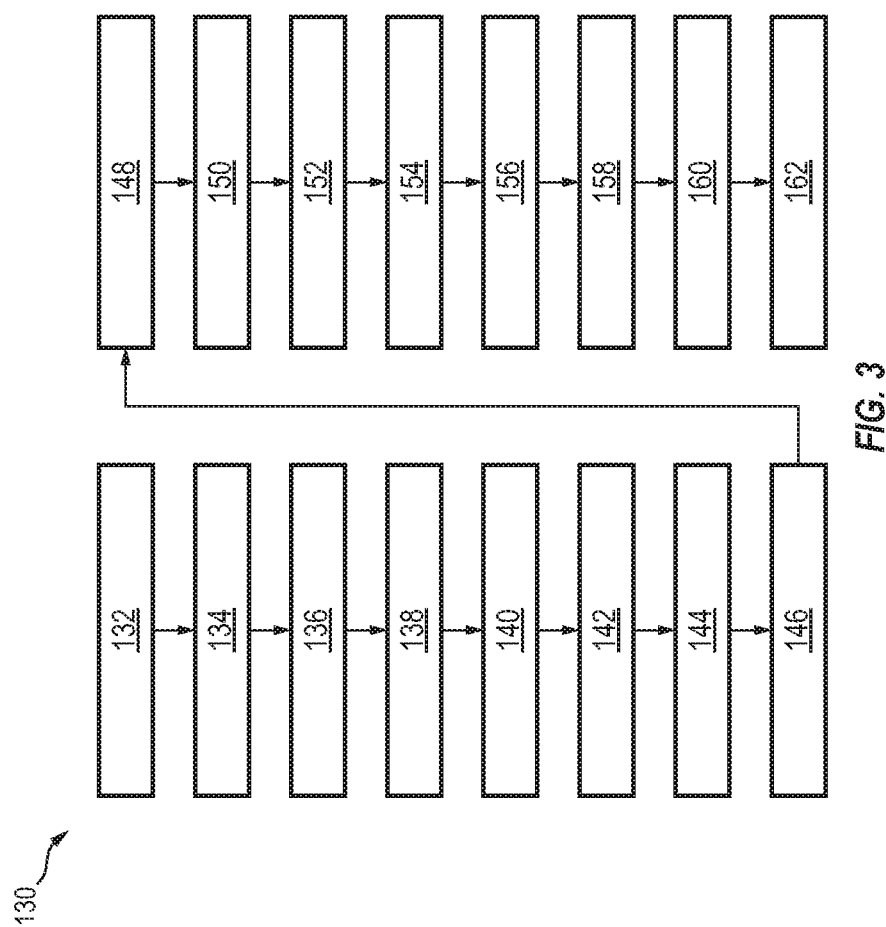
FIG. 3 illustrates a process flow or chart for forming semiconductor modules, modules, or semiconductor die modules.

FIG. 3 shows a non-limiting example of a process flow or chart 130 for formation a module, such as a module 100, 110, 114, or similar module such as a thermally enhanced fully molded fan-out module. The process flow 130 is shown in schematic form and described with respect to elements, actions, steps, or processes 132-162. The elements 132-162 are presented by way of illustration and not limitation, and while the elements can be performed in the order or sequence presented below, they need not be. Fewer elements, or additional elements, as well as the order or sequence of the various elements used in forming the module can be modified.

At element 132, electrical interconnects 28 can be plated on multiple semiconductor die 14 at a level of native semiconductor wafer 12. At element 134, each of the semiconductor wafers 12 can be probed to test functionality of each of the semiconductor die 14 in or on the semiconductor wafers 12. At element 136, the semiconductor wafers 12 can be thinned to a finished Si thickness less than 500 μm or less than 350 microns. At element 138, the semiconductor die 14 can be singulated from the semiconductor wafer 12. At element 140, known good semiconductor die 14 can be placed face up on the temporary carrier or substrate 36. At element 142, the semiconductor die 14 can be molded or encapsulated with the encapsulant or mold compound 42 to form the reconstituted wafer, embedded die panel, or plastic panel 58 of any desired size and shape. At element 144, the carrier 36 can be removed to expose backsides 18 of the molded semiconductor die 14. At element 146, the second surface or front side 56 of the embedded panel 58 can undergo a grinding process to expose the electrical interconnects 28. At element 148, the panel 58 can be scanned to measure a position and orientation of each semiconductor die 14 within the panel 58, within the first embedded portions 60, or within each first embedded portion 60.

At element 150 the build-up interconnect structure or high density, multi-layer RDL routing pattern 70 can be formed (using e.g., unit specific patterning) to align the build-up interconnect structure 70 to each semiconductor die 14. At element 152, the photo-imageable solder mask material 84 can be formed over the final RDL layer to form the SMD land pads 86. At element 154, the solderable surface finish can be applied over the exposed SMD land pads 86 to facilitate surface mount assembly of components. At element 156, the panel 58 can be optionally probed to test functionality of each embedded portion 60 within the panel 58. At element 158, the panel 58 can be optionally thinned by grinding or polishing a back of the panel 58 to reduce a thickness of the embedded semiconductor die 14, such as to a thickness less than 250 μm. At element 160, SMD components 90 can be attached to the SMD lad pads 86 using a SMT assembly process, which can comprise screen printing solder paste 97 over each SMD land pad 86 and placing SMD components 90 on the panel 58 such that the solderable terminations 91 of the SMD components 90 contact the land pads 86, and the solder 97 can be reflowed to couple the SMD components 90 to the SMD pads 86 on the panel 58. Finally, at element 162, the module units 100, 110, 114 can be singulated to separate them from the panel 58.

As such, a number of advantages can be provided or facilitated by the modules 100, 110, and 114, an exemplary and non-limiting listing of which includes: improved control of contact resistance to contact pads 22 on the semiconductor die 14, improved RF performance of the modules 110, 110, and 114, improved thermal performance and power distribution of the modules, improved mechanical reliability of the modules, a planar surface for fine pitch lithography for the build-up interconnect structure 70, mold compound 42 replacing the first fan-out dielectric layer, a high contrast surface between encapsulant 42 and conductive interconnects 28 for optical die position measurement, a fully protected semiconductor die 14 edge for low-k devices, and a planar surface with low panel warpage that simplifies SMT assembly.

Improved control of contact resistance to contact pads 22, such as Al contact pads 22, on the semiconductor die 14 can be provided. Improvement is with respect to face down wafer-level fan-out structures (WLFO) structures, such as eWLB, that typically require sputtering a barrier and seed layer to the plastic panel or molding compound in order to make contact to the Al bond pads or contact pads on the semiconductor die in order to prevent formation of aluminum oxide. Plastic panels or plastic wafers can be problematic in sputter deposition of barrier layers, such as Ti or TiW barrier layers, because plastic tends to out-gas, and trace amounts of oxygen present during the sputter etch and before seed layer deposition can form a few angstroms of aluminum oxide on the contact pads, resulting in high contact resistance, which can impede performance of the semiconductor die. Managing or preventing the formation of aluminum oxide can be accomplished through things like storing the panels in nitrogen before sputter, extended degas time in the sputter tool, extended pump down time to ensure a very low base pressure in the etch chamber, or through other suitable processes. In the fully molded structure of the first embedded portion 60 of the modules 100, 110, or 114, electrical interconnects 28 can be positioned within the encapsulant 42 to provide superior contact resistance with respect to Al or other contact pads 22 by applying Cu or other conductive interconnects 28 to the Si or native wafer 10 just like you would do in a flip-chip bump or wafer WLP process. As a result, the contact pads 22 of the semiconductor die 14 are protected by the molded or encased bond between the electrical interconnect 28 and the contact pad 22 so that the process risk (exposure and oxidation) is far lower for the embedded die panel 58 or first embedded portion 60 compared to face down fan-out structures without pillars, posts, or studs.

Improved RF performance for the modules 100, 110, or 114 can also be available with the layer of mold compound 42 disposed over the active surface 20 of the semiconductor die 14 and around the electrical interconnects 28 that can create an offset or gap of about 10-100 μm, 20-50 μm, or 30 μm (plus or minus 5 μm) between the active surface 20 of the semiconductor die 14 and the build-up interconnect structure 70, high density multilayer routing layer, or fan-out RDL layer. The additional offset can provide a buffer or space that facilitates desirable performance of features such inductors with a higher quality factor (Q).

Improved thermal performance and power distribution is also available for the modules 100, 110, and 114, which can be achieved by forming the conductive interconnects 28 of any size or shape. For example, the conductive interconnects 28 can be formed with small fine pitch Cu studs, with large Cu studs, and can further comprise power or ground planes formed on the same semiconductor die 14. Because the conductive interconnects 28 can be planarized after placing mold compound 42 over the front side 20 of the face up semiconductor die 14, concerns with bump height uniformity are reduced or eliminated even with large variations in bump size or size of conductive interconnects 28 coupled to the semiconductor die 14. With little or no concern with respect to bump size uniformity, large areas of conductive interconnects, including Cu interconnects can be used to more effectively distribute power to the semiconductor die 14. In some instance, planes of thick Cu can be created as part of, or as one or more, conductive interconnects 28, to improve thermal performance. Additionally, the thickness of the Cu layer can be modulated to tailor performance for different applications. The above advantages can be achieved relative to any "chips last" or flip-chip type structure in which all the solder bumps or conductive interconnects need to have an identical, same, or substantially similar size and shape.

Improved mechanical reliability for the modules 100, 110, and 114 is also available through the addition of mold compound 42 over the face or active surface 20 of the semiconductor die 14 and over and around die edges 17. In particular, in designs that have SMD land pads 86 positioned over the edge 17 of the semiconductor die 14, the fully molded structure or first embedded portion 60 can provide a planar surface mechanically isolated from the topography of the semiconductor die edge 17. In face down fan-out structures the fan-out build-up under the SMD component can be at least partially mechanically coupled to the semiconductor die and partially mechanically coupled to the mold compound, which can result in higher thermo-mechanical stress on interconnections, such as solder joints, resulting in solder joint failures or other failures.

Improvements with the modules 100, 110, and 114 can further comprise a planar surface for fine pitch lithography, which can be present because when the embedded die panel 58 is planarized after molding, facilitating fine pitch lithography, such as with formation of the build-up interconnect structure 70, with small depth of field in exposure. In addition, the first layer of the build-up interconnect structure 70, whether a dielectric layer like insulating layer 72 or a metal layer like conductive layer 74, can be formed over the single mold compound 42 with coplanar exposed surfaces or ends of conductive interconnects 28. The above improvement is in contrast with respect to face down fan-out or embedded die in substrate structures in which the first layer is formed over more than one base material, such as a semiconductor die and an encapsulant around the semiconductor die. As such, feature size is limited only by the capabilities of the lithography tool, which can now be in a range of about 2-5 μm line and space (or 4-10 μm pitch), or less, with a road map. A thinner photo-polymer layer can be applied to the panel since there is no die edge topography as there is in face down structures. With the planar face up structure there is no problem running very fine traces across the die edge.

Improvements with the modules 100, 110, and 114 can also comprise the mold compound 42 replacing the first fan-out dielectric layer, such as insulating layer 72, so that the first conductive layer 74 is placed in direct contact with the encapsulant 42. Omitting the first fan-out dielectric layer and applying the fan-out RDL 74 directly to the embedded die panel 58 can reduce cost, which can be of benefit for smaller parts with low interconnect density.

Within embedded die panel 58, a high contrast surface for optical measurement of position of semiconductor die 14 with respect to the encapsulant 42 is also made available. The fully molded structure is advantageous in the inspection process since it creates a very high contrast surface for inspection, which can include, e.g., Cu bumps appearing white against a black background. The encapsulant 42 over the active surface 20 of the semiconductor die 14 removes from the optical inspection process the distracting features present at the active surface 20 that could slow or complicate inspection. As such, the high contrast image produced by the current design allows for a very fast and reliable scan, which reduces the cost.

Improvements with the modules 100, 110, and 114 also allow for fully protected die edges 17 for low-k devices. Low-k devices often require a laser groove being formed before dicing of the semiconductor die, which creates additional topography at the die edge. The laser groove before dicing is an additional process step that increases time and expense, but is often required to prevent a particular failure mode. The particular failure mode occurs in face down structures, that might have test pads in a saw street be lifted or moved during singulation such that the lifted pad, which is conductive, will contact or short an RDL or interconnect structure when a thinner photo-polymer layer is used. The current modules 100, 110, and 114 allow for fully encapsulating the sensitive die edge structure with a single mold compound 42 rather than forming a mold compound to photo-polymer interface at or near the edge of the low-k device structure in order to avoid lifted structures and prevent shorts.

Improvements with the modules 100, 110, and 114 also allow for a planar surface with low warpage of embedded die panel 58 that simplifies SMD and SMT assembly. The structure of modules 100, 110, and 114 can be balanced with portions or layers of encapsulants 42 of similar thickness and material properties being disposed on the top and bottom of semiconductor die 14. Therefore, the stresses induced by the CTE mismatch between the semiconductor die 14 and the encapsulant 42 can be substantially balanced on both sides of the semiconductor die 14. The embedded die panel 58 can therefore remains relatively flat during the SMT processes and the mounding of SMD components 90, which can include placement of components at room temperature followed by reflow of solder at an elevated temperature in excess of 230 degrees Celsius.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A semiconductor module, comprising:
a fully molded base portion comprising:
    a planar surface;
    a semiconductor die disposed within the fully molded base portion, the semiconductor die comprising an active surface comprising contact pads,
    conductive pillars coupled to the contact pads of the semiconductor die, the conductive pillars extending to the planar surface, and
    an encapsulant material disposed over the active surface, four side surfaces, and around the conductive pillars, wherein ends of the conductive pillars are exposed from the encapsulant material at the planar surface of the fully molded base portion;
a build-up interconnect structure comprising a routing layer disposed over, and contained within, a footprint of the fully molded base portion;
a photo-imageable solder mask material disposed over the routing layer and comprising openings to form surface mount device (SMD) land pads electrically coupled to the semiconductor die and the conductive pillars; and
a SMD component electrically coupled to the SMD land pads with surface mount technology (SMT).

2. The semiconductor module of claim 1, wherein the photo-imageable solder mask comprises at least one of epoxy solder resist, polyimide, PBO, and silicone.

3. The semiconductor module of claim 1, wherein the SMD component being electrically coupled to the SMD land pads further comprises:
the SMD component comprising solderable terminations;
solder paste disposed over the SMD land pads; and
the solderable terminations being disposed over, and electrically coupled to, the SMD land pads while the solderable terminations are in contact with the solder paste.

4. The semiconductor module of claim 3, wherein SMD land pads comprise a solderable surface finish of: nickel (Ni) and gold (Au); Ni, palladium (Pd) and Au; tin (Sn); solder; or Organic Solderability Preservative (OSP).

5. The semiconductor module of claim 1, wherein the SMD component is coupled to the land pads with solder bumps.

6. The semiconductor module of claim 1, wherein the build-up interconnect structure comprises high-density multilayer routing layers.

7. The semiconductor module of claim 1, wherein:
the SMD component is partially within a footprint of the semiconductor die and partially without a footprint of the semiconductor die; and
at least one of the SMD land pads is positioned over an edge of the footprint of the semiconductor die within the fully molded structure.

8. The semiconductor module of claim 1, further comprising:
a first output connector of the module adapted to be coupled to a battery; and
a second connector of the module adapted to be coupled to a display.

9. The semiconductor module of claim 1, further comprising the semiconductor die in the fully molded base portion being fully testable before any SMD component is coupled to the SMD land pads.

10. A semiconductor module, comprising:
a fully molded base portion comprising:
    a planar surface;
    a semiconductor die disposed within the fully molded base portion, the semiconductor die comprising contact pads,
    conductive pillars coupled to the contact pads and extending to the planar surface, and
    an encapsulant material disposed over the active surface, four side surfaces, and around the conductive pillars, wherein ends of the conductive pillars are exposed from the encapsulant material at the planar surface of the fully molded base portion;
a build-up interconnect structure comprising a routing layer contained within a footprint of the fully molded base portion; and
a SMD component electrically coupled to the routing layer.

11. The semiconductor module of claim 10, wherein the SMD component being electrically coupled to the routing layer further comprises:
the SMD component comprising solderable terminations;
solder paste disposed over the routing layer; and
the solderable terminations being disposed over, and electrically coupled to, the routing layer when the solderable terminations are in contact with the solder paste.

12. The semiconductor module of claim 10, wherein the SMD component is coupled to the routing layer with solder bumps.

13. The semiconductor module of claim 10, wherein:
the SMD component is partially within a footprint of the semiconductor die and partially without a footprint of the semiconductor die.

14. The semiconductor module of claim 10, further comprising:
a first output connector of the module adapted to be coupled to a battery; and
a second connector of the module adapted to be coupled to a display.

15. The semiconductor module of claim 10, further comprising the semiconductor die in the fully molded base portion being fully testable before any SMD component is coupled to the SMD land pads.

16. A method of making a semiconductor module, comprising:
forming electrical interconnects on a semiconductor die;
encapsulating the semiconductor die with an encapsulant to form a first embedded portion with the electrical interconnects exposed from the encapsulant;
forming a build-up interconnect structure comprising a conductive RDL layer over the first embedded portion after encapsulating the semiconductor die, the build-up interconnect structure being electrically connected to the electrical interconnects;
forming surface mount device (SMD) land pads electrically coupled to the conductive RDL layer; and
coupling a SMD component to the SMD land pads with surface mount technology (SMT) to provide an electrical connection between the SMD component and the semiconductor die through the conductive pillars and the build-up interconnect structure.

17. The method of claim 16 further comprising forming the SMD land pads by:
disposing a photo-imageable solder mask material over the conductive RDL layer;

forming openings in the photo-imageable solder mask material over the conductive RDL layer; and applying a solderable surface finish of nickel (Ni) and gold (Au); Ni, palladium (Pd) and Au; tin (Sn); solder; or Organic Solderability Preservative (OSP) over the SMD land pads.

18. The method of claim 16, wherein coupling the SMD component to the SMD land pads further comprises:

screen printing solder paste over each of the SMD land pads;

placing solderable terminations of the SMD components over the first embedded portion such that solderable terminations contact the solder paste over the SMD land pads; and reflowing the solder paste to couple the SMD components to the SMD land pads.

19. The method of claim 16, further comprising electrically testing the semiconductor die within the first embedded portion before coupling any of the SMD components to the first embedded portion.

20. The method of claim 16, further comprising coupling the SMD component to the SMD land pads so that the SMD component is partially within a footprint of the semiconductor die and partially without a footprint of the semiconductor die.

* * * * *